United States Patent
Xu et al.

(10) Patent No.: US 12,044,737 B2
(45) Date of Patent: Jul. 23, 2024

(54) FAST SCREENING OF RECHARGEABLE BATTERIES USING SECTIONAL CONSTANT-CURRENT IMPULSE RATIO (SCCIR) CALIBRATION WITH CONSTANT-CURRENT FOLLOWED BY CONSTANT-VOLTAGE CHARGING

(71) Applicant: Hong Kong Applied Science and Technology Research Institute Company Limited, Hong Kong (HK)

(72) Inventors: Minjie Xu, Hong Kong (HK); Meng Chen, Hong Kong (HK); Yaofeng Sun, Hong Kong (HK)

(73) Assignee: Hong Kong Applied Science and Technology Research Institute Company Limited, Hong Kong (HK)

( * ) Notice: Subject to any disclaimer, the term of this patent is extended or adjusted under 35 U.S.C. 154(b) by 439 days.

(21) Appl. No.: 17/568,695

(22) Filed: Jan. 4, 2022

(65) Prior Publication Data

US 2022/0252670 A1 Aug. 11, 2022

Related U.S. Application Data

(63) Continuation-in-part of application No. 17/169,675, filed on Feb. 8, 2021, now Pat. No. 11,656,291.

(51) Int. Cl.
*G01R 31/367* (2019.01)
*G01R 31/3842* (2019.01)
*G01R 31/392* (2019.01)

(52) U.S. Cl.
CPC ......... *G01R 31/367* (2019.01); *G01R 31/392* (2019.01)

(58) Field of Classification Search
CPC .... G01R 31/367; G01R 31/392; Y02W 30/84
See application file for complete search history.

(56) References Cited

U.S. PATENT DOCUMENTS 8,937,459 B2   1/2015   Park
2009/0128097 A1   5/2009   Esnard
(Continued)

FOREIGN PATENT DOCUMENTS

CN   103545567 A   1/2014
CN   103545567 B   2/2016
(Continued)

OTHER PUBLICATIONS

ISR and Written Opinion, PCT/CN2022/070518, Mar. 29, 2022.
(Continued)

*Primary Examiner* — Jermele M Hollington
*Assistant Examiner* — Temilade S Rhodes-Vivour
(74) *Attorney, Agent, or Firm* — Stuart T. Auvinen; gPatent LLC

(57) ABSTRACT

Used batteries are screened based on a measured Sectional Constant-Current Impulse Ratio (SCCIR). A used battery is partially charged over a small voltage range using a Constant Current (CC) until a voltage target is reached, and the current integrated to obtain the CC charge applied, Qcc. Then the battery continues to be charged using a Constant Voltage (CV) of the voltage target until the charging current falls to a midrange current target before the battery is fully charged. The current is integrated over the CV period to obtain the CV charge applied, Qcv. The measured SCCIR is the ratio of Qcc to (Qcc+Qcv) and is input to a calibration curve function to obtain a modeled State of Health (SOH) value for sorting. The calibration curve function is obtained by aging new batteries to obtain SCCIR and SOH data that are modeled using a neural network.

20 Claims, 11 Drawing Sheets

(56) References Cited

U.S. PATENT DOCUMENTS

| | | | | |
|---|---|---|---|---|
| 2014/0084867 | A1* | 3/2014 | Hamaoka | H02J 5/00 320/136 |
| 2016/0054343 | A1* | 2/2016 | Holmes | G01N 35/026 422/65 |
| 2016/0245876 | A1 | 8/2016 | Vinassa et al. | |
| 2017/0038436 | A1 | 2/2017 | Montaru | |
| 2020/0309857 | A1* | 10/2020 | Zeyghami | H02J 7/0068 |
| 2020/0335979 | A1 | 10/2020 | Kim et al. | |

FOREIGN PATENT DOCUMENTS

| | | |
|---|---|---|
| CN | 103840225 B | 9/2016 |
| CN | 106970266 A | 7/2017 |
| CN | 107329094 A | 11/2017 |
| CN | 107785624 A | 3/2018 |
| CN | 108445406 A | 8/2018 |
| CN | 109061505 A | 12/2018 |
| CN | 109143108 A | 1/2019 |
| CN | 110058159 A | 7/2019 |
| CN | 110501652 A | 11/2019 |
| CN | 110703121 A | 1/2020 |
| CN | 111007417 A | 4/2020 |
| CN | 111308379 A | 6/2020 |
| CN | 111965559 A | 11/2020 |
| EP | 3324197 A | 5/2018 |

OTHER PUBLICATIONS

Lin Chen et al., "A new state-of-health estimation method for lithium-ion batteries through the intrinsic relationship between ohmic internal resistance and capacity" Measurement 116 (2018) pp. 586-595, Dec. 2, 2017.

Ruifeng Zhang et al., "Study on the Characteristics of a High Capacity Nickel Manganese Cobalt Oxide (NMC) Lithium-Ion Battery—An Experimental Investigation", Energies 2018, 11, 2275, 20pp, Aug. 29, 2018.

* cited by examiner

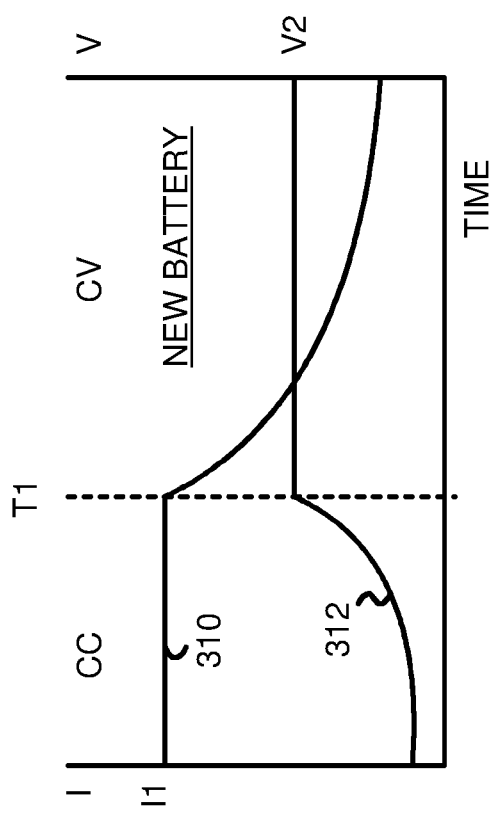
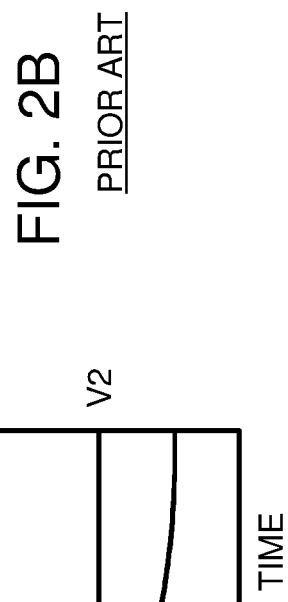
FIG. 2A PRIOR ART
FIG. 2B PRIOR ART

CCIR

SCCIR

| SAMPLE # | V1 | V2 | IMID |
|---|---|---|---|
| 1 | 2.75 | 3.4 | 0.19C |
| 2 | 2.75 | 3.5 | 0.19C |
| 3 | 2.75 | 3.52 | 0.19C |
| 4 | 2.75 | 3.6 | 0.19C |
| 5 | 2.75 | 3.5 | 0.15C |
| 6 | 3.4 | 3.6 | 0.15C |
| 7 | 3.4 | 3.62 | 0.15C |
| 8 | 3.7 | 3.8 | 0.15C |

FIG. 10

FAST SCREENING OF RECHARGEABLE BATTERIES USING SECTIONAL CONSTANT-CURRENT IMPULSE RATIO (SCCIR) CALIBRATION WITH CONSTANT-CURRENT FOLLOWED BY CONSTANT-VOLTAGE CHARGING

RELATED APPLICATION

This application is a Continuation-In-Part (CIP) of "Fast Screening Method for Used Batteries Using Constant-Current Impulse Ratio (CCIR) Calibration", U.S. Ser. No. 17/169,675, filed Feb. 8, 1921.

FIELD OF THE INVENTION

This invention relates to battery screening methods, and more particularly for methods to screen aged or retired batteries for re-use.

BACKGROUND OF THE INVENTION

Electric batteries are widely deployed to power various systems, including Electric Vehicles (EV's). Each EV requires a large battery pack to provide the significant power required to propel the EV.

More expensive Lithium-ion batteries are often used with EV's. The chemicals used in such advanced batteries pose disposal problems. Toxic chemicals can leak from disposed batteries and contaminate water sources. As EV's grow in popularity, additional burdens will be placed on disposal landfills as EV batteries are retired from service.

Recycling Lithium-ion and other batteries may require acids or furnaces that can cause additional environmental concerns. Low profit margins make battery recycling unattractive.

EV battery packs in particular may be replaced prematurely. The EV manufacturer's recommendations may dictate that repair shops swap out battery packs that fall below a fairly high discharge capacity needed to ensure sporty EV performance. The EV battery packs may be removed before all of the battery cells have worn out. Especially for large battery packs, there may be many cells or groups of cells that still have a significant useful life remaining. These battery cells could be useful for powering other systems that have less stringent power requirements, such as communication and computer backup systems. Rather than dispose of the replaced EV batteries in a landfill or melting them down, re-using EV batteries may extend their useful lifetime by as much as 5 to 7 years, providing a more sustainable and environmentally-friendly approach.

The usability of a used battery can be defined by its State-of-Health (SOH) ratio. The SOH is the ratio of the battery's current energy storage capacity to that battery's initial or nominal energy storage capacity. Storage capacity is approximated by the battery's discharge capacity.

FIG. 1 shows a prior-art battery capacity test. Many variations are possible and FIG. 1 is merely for illustration and is not necessarily representative of any particular battery test.

Accurately measuring a battery's full storage capacity can require a lot of time. Rapid charging or discharging can heat the battery and affect measurements. The battery initially may have a residual charge stored that needs to be discharged before capacity measurements.

The battery being tested is initially charged to 3.8 volts by applying a Constant Current (CC) having a value of 1 C amps, and then once the voltage target of 3.8 volts is reached, reducing this current to maintain a Constant Voltage (CV) or 3.8 volts, step 202. The current will fall during the CV phase until a low current value is reached, such as 0.01 C, or until a time period has elapsed.

The battery is allowed to cool for one hour before the next step. Also, the battery may be allowed to cool for 10 minutes before the initial charging of step 202.

After the 1-hour cooling period, the battery is discharged using a Constant Current (CC) having a fixed current value of 1 C. Once the battery's voltage falls from 3.8 volts to 2.8 volts, discharging stops and the battery is allowed to rest and cool for an additional hour, step 204.

The battery is then charged to a higher voltage of 4.25 volts by applying a Constant Current (CC) of 1 C, and then when the battery voltage reaches 4.25 volts, Constant Voltage (CV) charging is performed where the current is reduced to maintain a constant battery voltage of 4.25 volts. After the charging current falls below a lower threshold, charging ends and the battery allowed to rest and cool for another hour, step 206.

Finally the battery is slowly discharged using a Constant Current (CC) of only 5% of the earlier discharge current, or 0.05 C. This discharge current continues until the battery voltage reaches 2.8 volts, step 208. The battery's discharge capacity is measured by integrating the 0.05 C discharge current over the time required to reach the 2.8-volt endpoint. This integrated current can be compared with the specified charge for a similar test on a new battery to calculate the SOH ratio.

The 0.05 C low-current in discharge step 208 may require a long time period, such as 20 hours, when the 1 C discharge of step 204 exceeds one hour. The total test time may exceed 26 hours, including the hour-long rest periods in steps 202, 204, 206. This lengthy test time is costly and undesirable.

Existing fast screening methods such as Coulomb Counting and Internal Resistance methods may suffer from such long test periods. The goodness of fit may be lower for the Internal Resistance method. Complex setups may be needed with these methods.

What is desired is a faster screening method for used batteries. It is desired to measure the discharge capacity of used batteries using a higher current and over a smaller voltage range to speed testing. It is desired to more rapidly determine battery health using a combination of Constant-Current and Constant-Voltage methods. A calibrated method using Artificial Intelligence (AI) is desired to screen used batteries.

BRIEF DESCRIPTION OF THE DRAWINGS

FIGS. 2A-2B are graphs of CC-CV charging of new and used batteries.

FIG. 10 is a table of calibration sample data for various combinations of V1, V2, and Imid.

DETAILED DESCRIPTION

The present invention relates to an improvement in battery screening. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

FIGS. 2A-2B are graphs of CC-CV charging of new and used batteries. In FIG. 2A, a new battery is charged by applying a Constant Current (CC), such as 0.2 C, until the battery voltage, curve 312, reaches V2 at time T1. The Constant Current may be determined based on the working current or the nominal current defined in the specification file of the batteries. Then at time T1 the charging mode changes from CC to CV. In Constant-Voltage (CV) mode, the voltage applied to the battery remains fixed at V2 while the charging current is adjusted. In particular, the charging current, curve 310, drops from I1 during CV mode as the battery nears full charge. CV mode can be determined and charging stopped when some endpoint is reached such as the charging current falling to a threshold value, such as 10% of CC, or 0.02 C.

Figure 1:
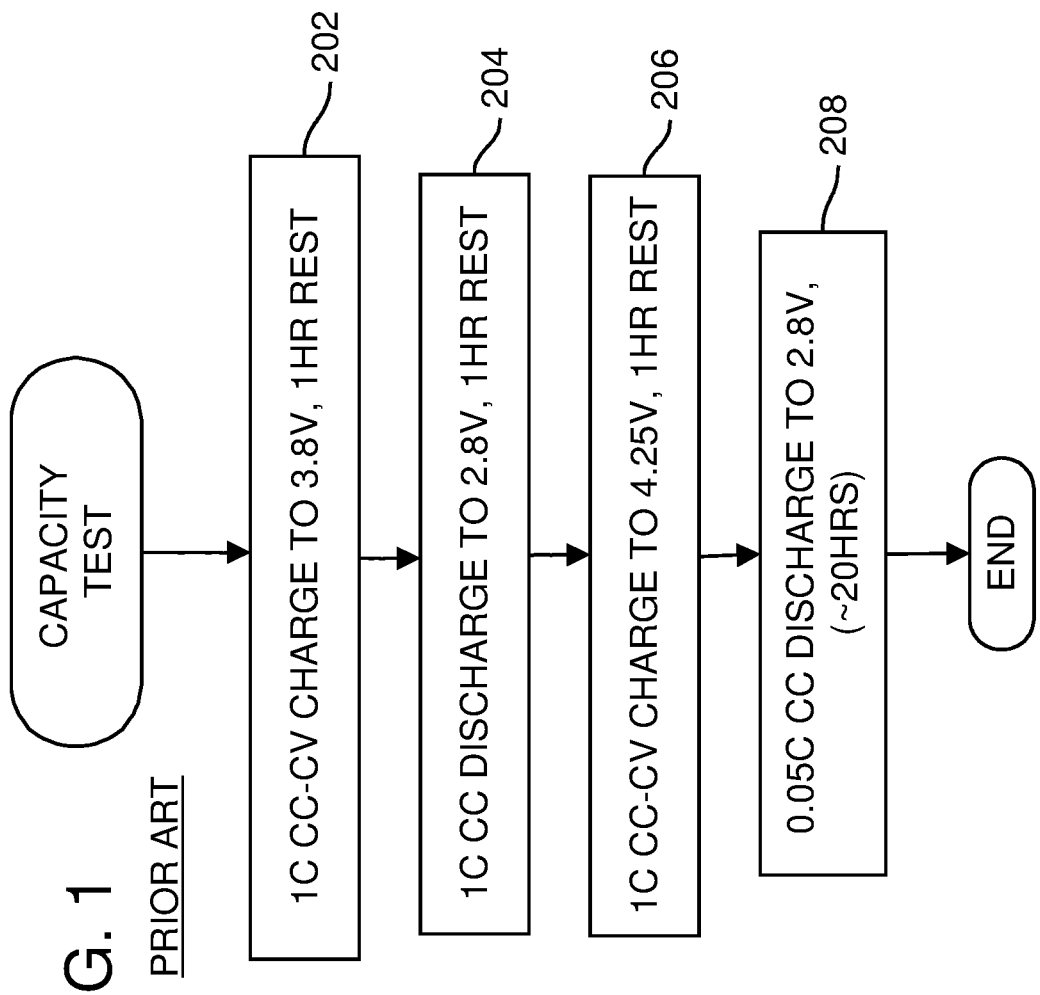
FIG. 1 shows a prior-art battery capacity test.

In FIG. 2B, an older used battery is charged using the same CC-CV method. An older used battery will store less charge than a new battery. Thus when the same constant current of I1 is applied during CC mode, the used battery voltage reaches target voltage V2 at an earlier time T1' for the used battery of FIG. 2B than for the newer battery of FIG. 1A. Voltage curve 312' rises more rapidly to V2 for the older battery of FIG. 2B than for curve 312 for the newer battery of FIG. 2A.

Internal resistance within the used battery may have increased, requiring a shorter time for CC mode. Current curve 310' for the used battery of FIG. 2B tends to drop off at a slower rate than does current curve 310 for the new battery of FIG. 2A.

The Constant-Current Impulse is initial constant-current impulse that is needed for the battery to reach a target voltage. The Constant-Current Impulse period for the new battery of FIG. 2A is time T1, while the Constant-Current Impulse period for the used battery of FIG. 2B is time T1'. The charge Qcc supplied to the battery during the Constant-Current Impulse is I1*T1 for the new battery, and I1*T1' for the used battery.

The remaining charge provided to the battery during the CV period, Qcv, can be obtained by integrating the current over time during the CV period. Current curve 310 is integrated over the CV phase, from T1 to the endpoint, to obtain Qcv for the new battery, while current curve 310' is integrated over the CV phase, from T1' to the endpoint, to obtain Qcv for the used battery.

As described in the parent application, the aging or health of the battery can be expressed as the Constant-Current Impulse Ratio (CCIR) of the CC charge to the total charge, or $$CCIR = Q_{cc}/(Q_{cc}+Q_{cv}).$$

The inventors have realized that the shift in the CC-CV transition point T1 can be used as a measure of a battery's aging or health. In particular, the inventors measure the CC charge Qcc before T1, and then measure the CV charge Qcv after T1, to be able to calculate the Constant-Current Impulse Ratio (CCIR). The CCIR is then compared to a calibration curve to determine the battery's State of Health (SOH). Batteries are sorted and discarded or reused based on their SOH values.

Figure 3A:
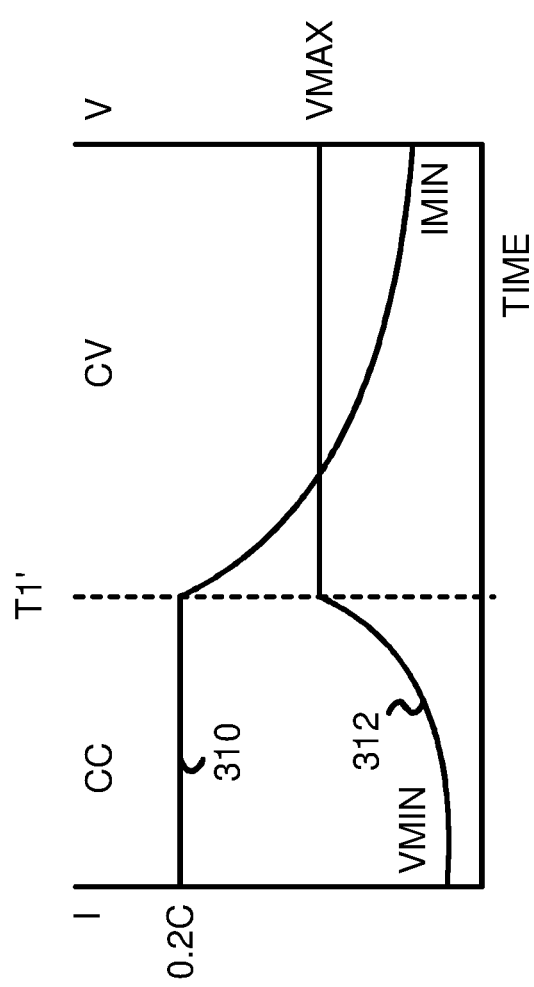
FIGS. 3A-3B are graphs of CC-CV charging using the CCIR method of the parent application, and the Sectional-CCIR (SCCIR) method of the present application.
Figure 3B:
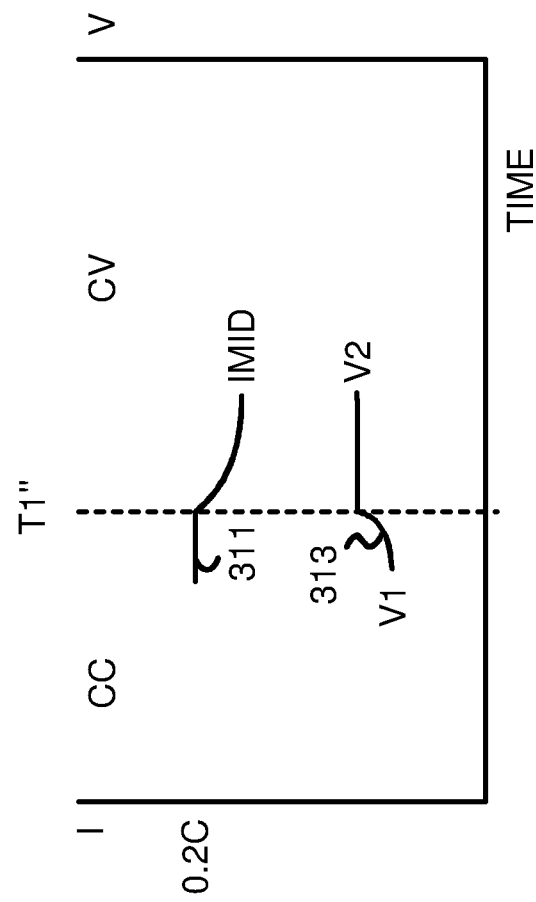

FIGS. 3A-3B are graphs of CC-CV charging using the CCIR method of the parent application, and the Sectional-CCIR (SCCIR) method of the present application.

In FIG. 3A, as disclosed in the parent application, the used battery under test is first charged with a Constant Current CC as the voltage rises from Vmin to Vmax. Once Vmax is reached at time T1', the battery charger switches from CC mode to CV mode. The battery voltage is maintained constant at Vmax while the battery current falls from the CC value of 0.2 C to Imin. While this CCIR method is useful, the test time required is relatively long since the battery is charged all the way from Vmin to Vmax. The inventors desire to reduce the test time.

In FIG. 3B, the Sectional-CCIR method charges the used battery over a smaller range of voltages, from V1 to V2. Rather than initially discharge the used battery to Vmin, the battery is initially discharged or charged to a typically higher voltage V1. The target voltage at time T1" is V2, which is lower than Vmax. Curve 313 is shorter in time duration than curve 312 because V2–V1 is smaller than Vmax–Vmin, making the CC time period shorter. Thus the SCCIR method of FIG. 3B requires less test time than the CCIR method of FIG. 3A.

Rather than charge the battery during CV mode to minimum current Imin, as shown in FIG. 3A, CV mode is stopped earlier at a higher target current Imid in FIG. 3B. Curve 311 has a shorter duration than curve 310 because Imid is closer to the initial current of 0.2 C than Imin.

The inventors have realized that the used battery does not have to be completely discharged and then fully charged. A limited charge over a smaller voltage range can still produce valid results that can be modeled using Artificial Intelligence (AI). The SCCIR method reduces test time relative to the CCIR method because the battery is charged over a smaller range of voltages, and with a smaller current change. Only smaller sections of the full CCIR voltage and current ranges are tested with the Sectional-CCIR method. Faster screening of retired batteries is possible with the SCCIR method.

Figure 4:
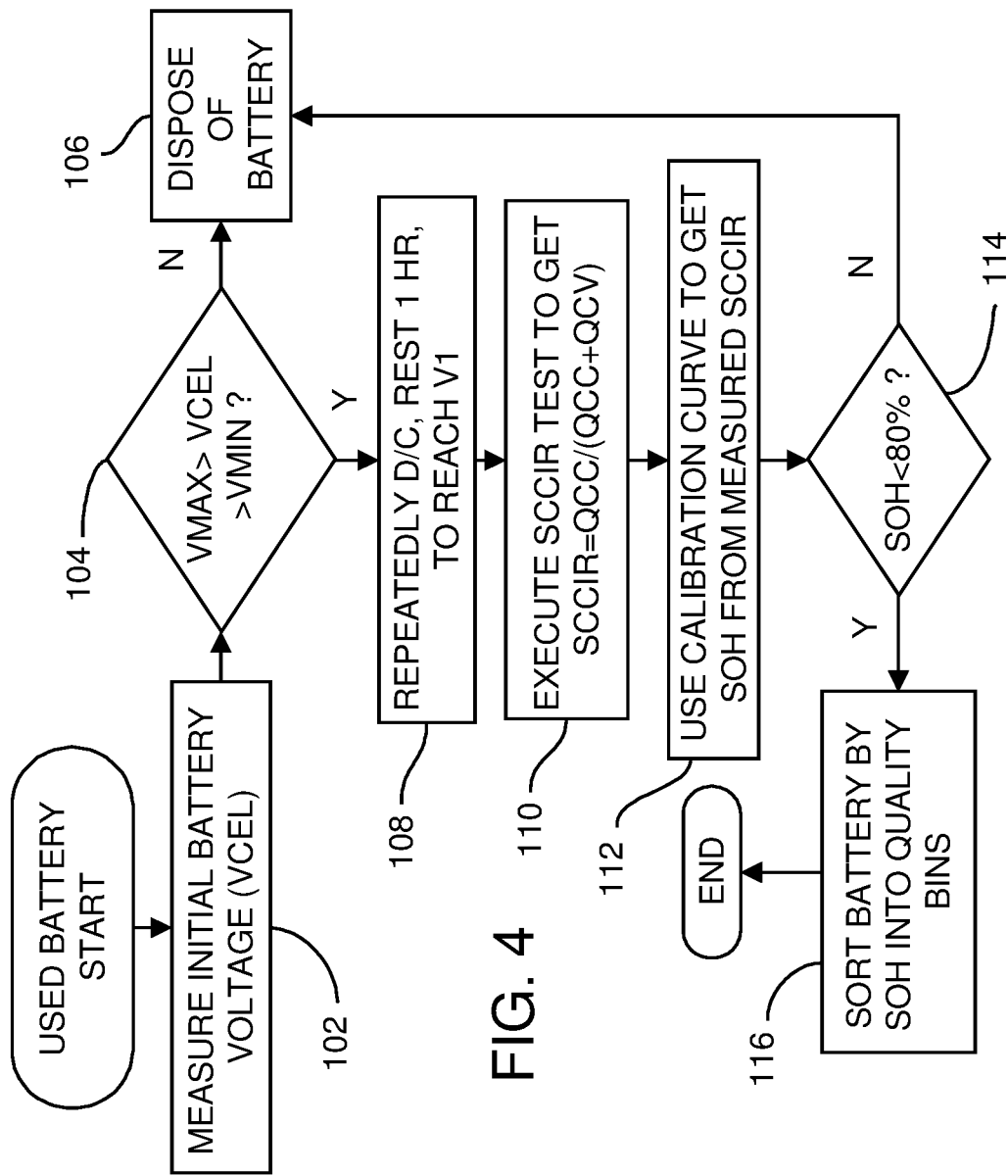
FIG. 4 is a method to test and sort batteries based on their SCCIR ratios measured during CC-CV charging.

FIG. 4 is a method to test and sort batteries based on their SCCIR ratios measured during CC-CV charging. The voltage of each used battery is measured as Vcel, step 102. When Vcel is above a maximum voltage Vmax or is below a minimum voltage Vmin, step 104, the battery is disposed of, step 106.

Batteries having initial voltage Vcel between Vmin and Vmax, step 104, are processed further. Since starting voltage V1 is less than Vmax, some batteries may need to be discharged to reach V1. As V1 is also above Vmin, other batteries may need to be charged to reach V1. Batteries are repeatedly charged or discharged until V1 is reached, step 108. A 1-hour rest may be added after each charge or discharge to allow the battery to cool.

Figure 5:
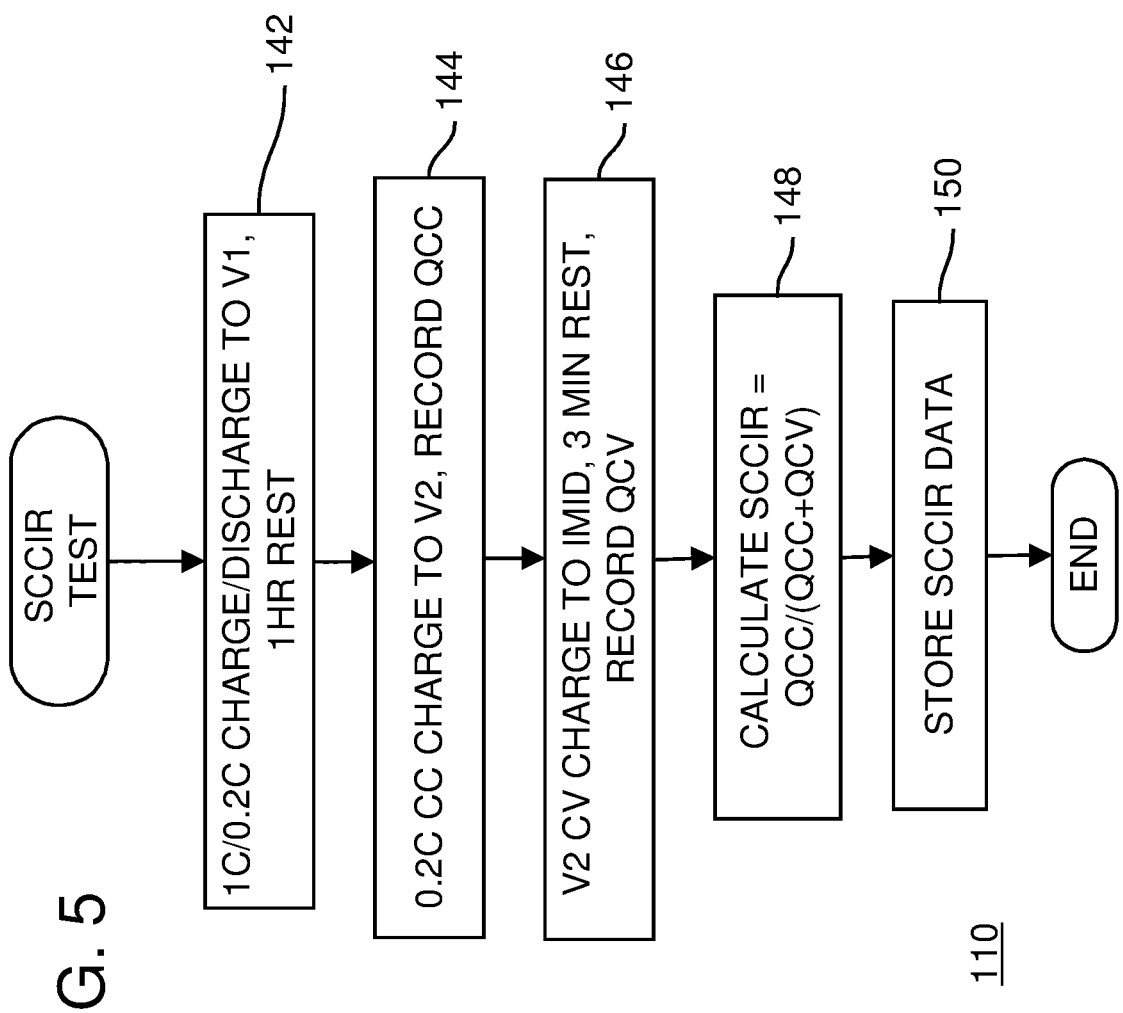
FIG. 5 shows the SCCIR test in more detail.

SCCIR test 110, shown in FIG. 5, is performed on the used battery to measure the charge during CC mode, Qcc, and the charge during CV mode, Qcv. With Qcc and Qcv, the Sectional Constant-Current Impulse Ratio (SCCIR) is calculated as Qcc/(Qcc+Qcv).

The SCCIR value calculated from the CC and CV charging measurements is compared to a calibration curve to obtain a State of Health (SOH) value, step 112. A dataset of new batteries are aged by repeated charge/discharge cycles (FIG. 6) and modeled using AI to obtain the calibration curve (FIG. 7).

The SOH for the battery being tested is compared to a SOH threshold, such as 80%, step 114, and batteries with SOH below the threshold are disposed of, step 106. Batteries above the SOH threshold are sorted into quality bins based on their SOH values, step 116. The sorted batteries may be reused for various applications based on the quality bins. Some applications may require higher-quality reused batteries than other applications. For example, batteries with SOH above 95% could command a higher price and be used in more demanding applications than batteries with SOH between 85 and 80%.

FIG. 5 shows the SCCIR test in more detail. The battery to be tested is initially charged or discharged using a constant current of 1 C and/or 0.2 C until the target starting voltage V1 is reached, step 142. A larger current of 1 C may be initially used when Vcel is far from V1, while a smaller current of 0.2 C used when reaching V1. The battery is allowed to cool and rest for one hour.

After the rest period, the battery is charged with a Constant Current (CC) of 0.2 C until a target ending voltage V2 is reached, step 144. The constant current is integrated over time to obtain Qcc. Qcc is stored or otherwise recorded.

Charging then switches from CC mode to CV mode. The battery voltage is held constant at V2 while the charging current is reduced over time to maintain V2. Once a final charging current Imid is reached, the CV charging mode ends, and the battery rests and cools for 3 minutes, step 146. The current that falls from 0.2 C at the start of the CV phase to Imid, and the end of the CV phase is integrated over the time of the CV phase to obtain the CV charge Qcv. Qcv is stored in a computer memory or otherwise recorded.

The current SCCIR is calculated for the battery being tested, step 148. SCCIR is calculated as the ratio of Qcc to Qcc+Qcv. SCCIR represents the percentage of the total charge during the CC phase. The SCCIR value for the battery being tested is stored, step 150, such as being written into a computer memory such as a register file, SRAM, DRAM, or hard disk. Qcc is smaller for the SCCIR method than for the CCIR method due to V2−V1 being less than Vmax−Vmin. Likewise, Qcv is smaller for the SCCIR method than for the CCIR method due to Imid being greater than Imin.

Figure 6:
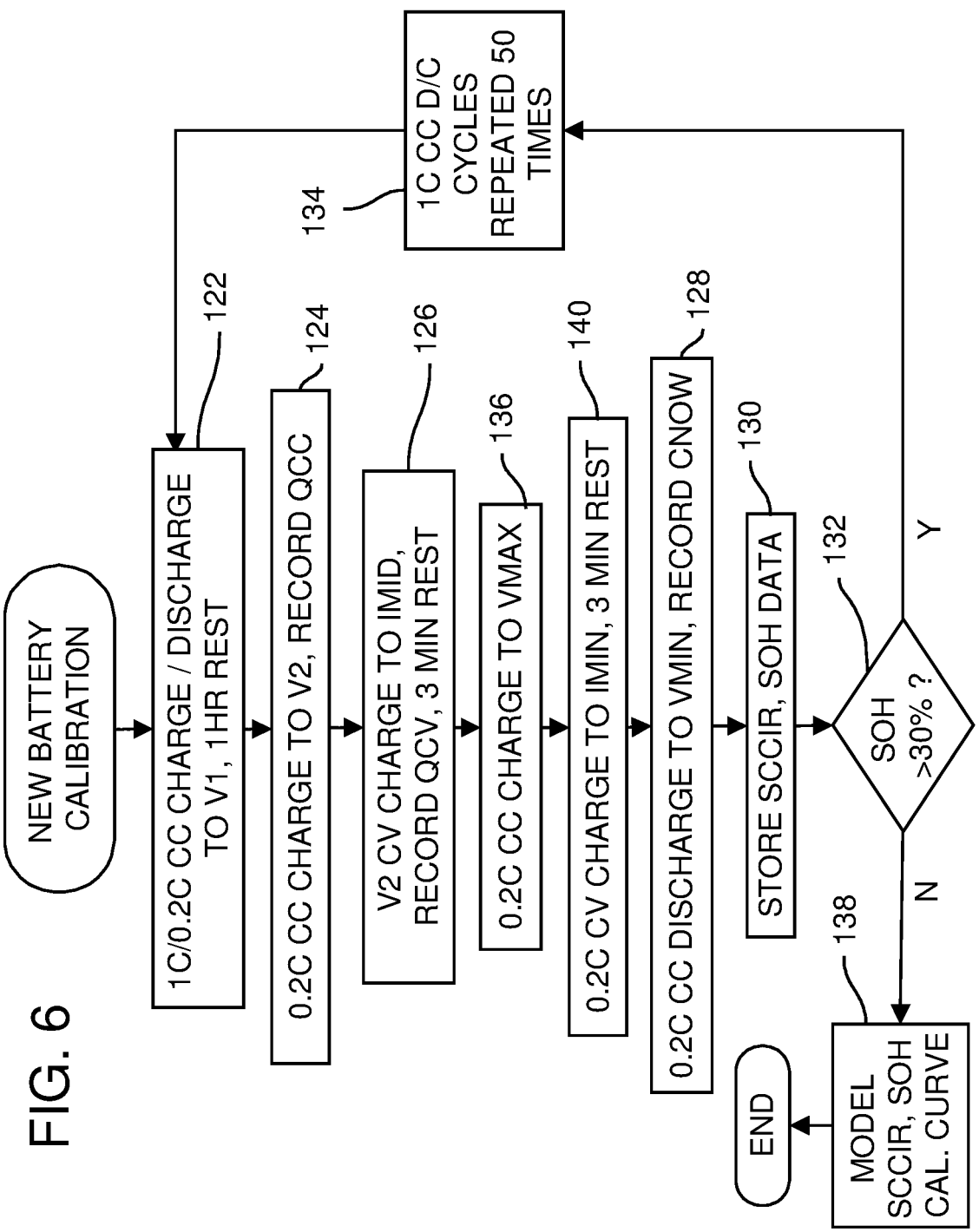
FIG. 6 shows a process to age a new battery to obtain SCCIR values to model a calibration curve.
Figure 7:
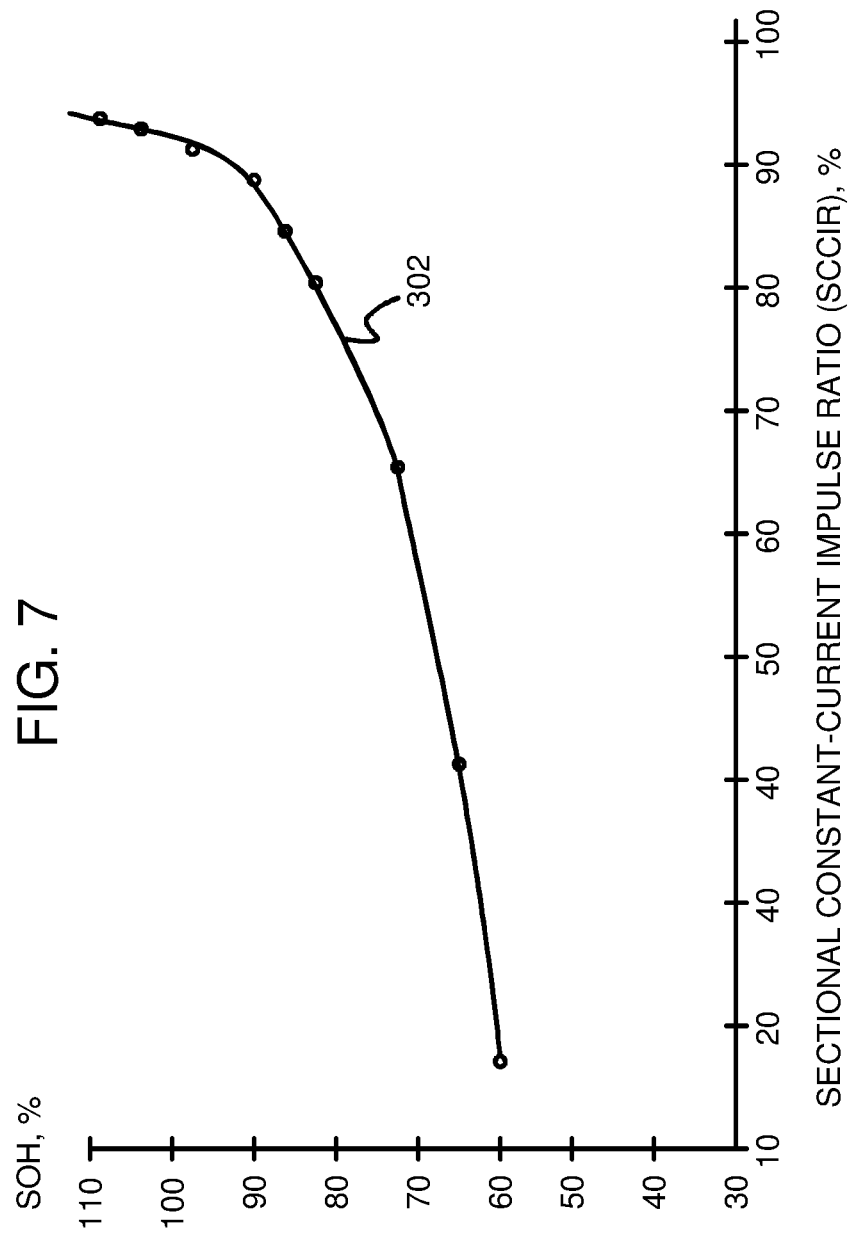
FIG. 7 is a graph of a calibration curve of SOH as a function of SCCIR.

FIG. 6 shows a process to age a new battery to obtain SCCIR values to model a calibration curve. The process of FIG. 6 can be repeated using many new batteries to obtain a dataset that can model a calibration curve that can be used for sorting used batteries. Calibrating as few as 3 batteries may provide sufficiently accurate modeling data.

The new battery to be tested for calibration is initially discharged using a constant current of 0.2 C until voltage V1 is reached, step 122. The battery is allowed to cool and rest for one hour.

After the rest period, the battery is charged with a Constant Current (CC) of 0.2 C until voltage V2 is reached, step 124. The constant current is integrated over time to obtain Qcc. Qcc is stored or otherwise recorded.

Charging then switches from CC mode to CV mode. The battery voltage is held constant at V2 while the charging current is reduced over time to maintain V2. Once a final charging current Imid is reached, the CV charging mode ends, and the battery rests and cools for 3 minutes, step 126. The current that falls from 0.2 C at the start of the CV phase to Imid and the end of the CV phase is integrated over the time of the CV phase to obtain the CV charge Qcv. Qcv is stored in a computer memory or otherwise recorded.

Since V2-V1 is less than Vmax-Vmin, the battery was only partially charged during the SCCIR test. To obtain an accurate SOH, the full charging capacity of the battery is obtained in steps 136, 140, 128. In step 136, the battery is charged from V2 up to the maximum voltage Vmax using a constant current of 0.2 C. Charging continues using a constant voltage (CV) of Vmax, step 140, until the battery current falls to the specified minimum value Imin, and the battery is fully charged.

The now fully-charged battery is discharged using a constant current of 0.2 C until Vmin is reached, step 128. The 0.2 C constant current is integrated over time to obtain the aged battery's present charging capacity, Cnow. The aged battery's current State of Health (SOH) is calculated as Cnow/Cinit, where Cinit is the initial charging capacity of the battery before aging, which can be measured in step 128 before any aging has occurred from charge/discharge cycling in step 134.

SCCIR is calculated from Qcc obtained from step 124, and Qcv obtained in step 126, as SCCIR=Qcc/(Qcc+Qcv). Both SCCIR and SOH are stored in a computer memory, step 130.

When SOH is above 30%, step 132, the battery is aged by performing 50 discharge/charge cycles using a constant current of 1 C, step 134. Then the SCCIR sequence is repeated starting at step 122. The battery's SOH is gradually reduced by the discharge/charge cycling of step 134. Once the SOH falls below 30%, step 132, the stored SCCIR and SOH data is applied to an AI engine to generate a model of SOH as a function of SCCIR, the calibration curve, step 138.

FIG. 7 is a graph of a calibration curve of SOH as a function of SCCIR. The SOH, SCCIR datapoints obtained by the aging process of FIG. 6 are plotted as points in the graph. Calibration curve 302 is a best-fit function that best fits these data points. Calibration curve 302 is used by step 112 of FIG. 4 to obtain a modeled SOH value for a SCCIR calculated from measurements during CC-CV charging of a used battery.

Calibration curve 302 can be obtained from AI modeling of these (SOH, SCCIR) datapoints, such as using a least-squares method to find parameters to optimize using a neural network. Other statistical methods could be used.

Artificial Neural Networks (ANNs) may be used to generate a model of SOH as a function of SCCIR. Artificial Neural Networks are especially useful for processing large amounts of non-linear data in complex ways that are hard to define using traditional computer programs. Instead of being programmed with instructions, training data is input to a neural network and compared to the expected output, then adjustments are made within the neural network and the training data is again processed and outputs compared to generate further adjustments to the neural network. After many such training cycles, the neural network is altered to efficiently process data similar to the training data and expected outputs. Neural networks are an example of machine learning, since the neural network learns how to generate the expected outputs for the training data. Real data similar to the training data can then be input to the neural network to process live data.

Figure 8:
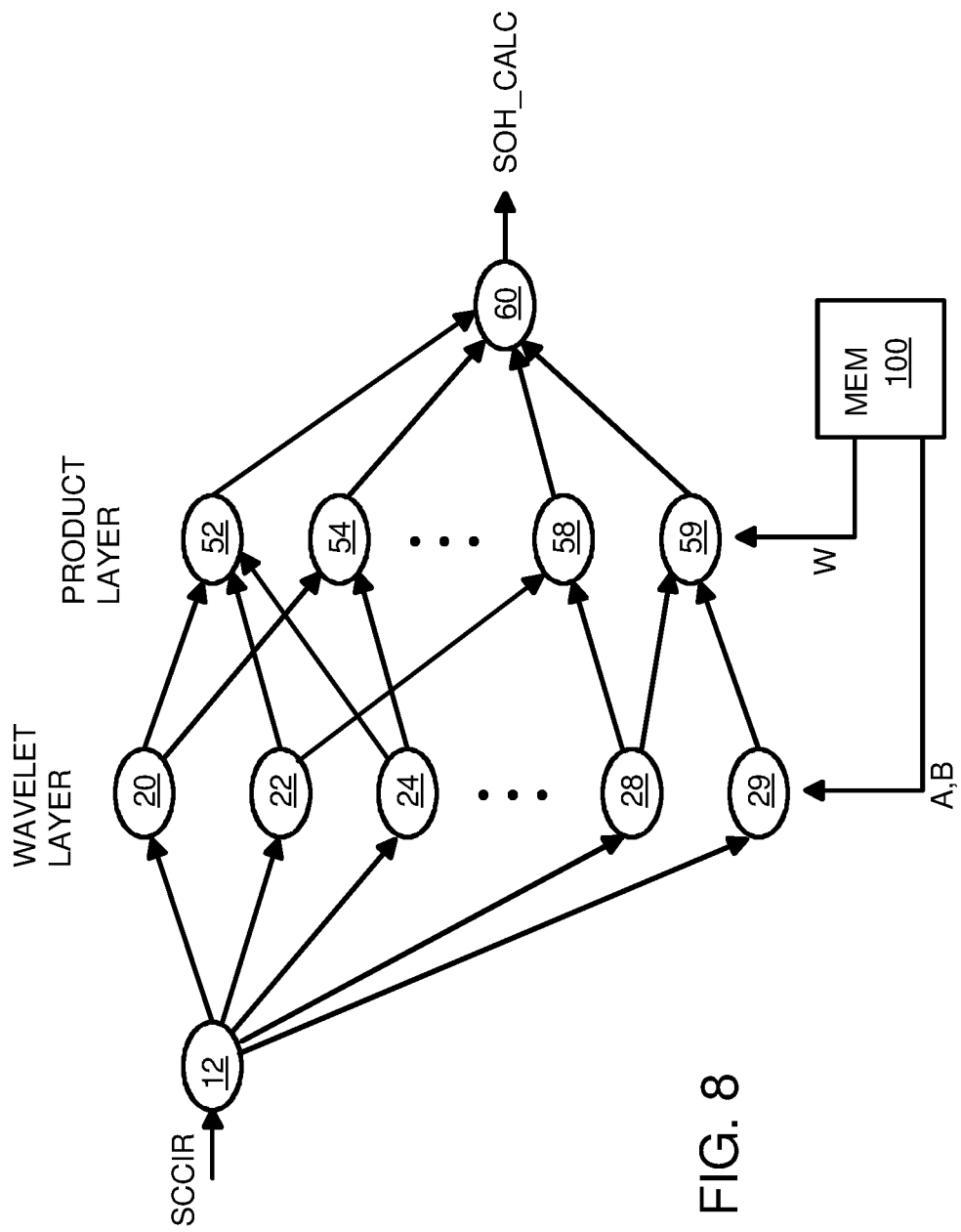
FIG. 8 illustrates a neural network for modeling the calibration curve of SOH as a function of SCCIR.

FIG. 8 illustrates a neural network for modeling the calibration curve of SOH as a function of SCCIR. Input node 12 receives input data SCCIR, while output node 60 outputs the result of the neural network's operations, SOH_CALC, which is the modeled SOH value for the input SCCIR value. Two layers of operations are performed within this neural network. Nodes 20, 22, 24, . . . 28, 29, each take inputs from input node 12, perform a wavelet function operation, and send an output to nodes in the second layer. Second-layer nodes 52, 54, . . . 58, 59 also receive multiple inputs, combine these inputs to generate an output, such as by generating products, and sends the outputs on to third-level node 60, which similarly combines or sums the inputs to generates an output.

The inputs at each level are typically weighted, so weighted sums (or other weighted operation results) are generated at each node. Each input at a node can be assigned a weight that is multiplied by that input before all the weighted inputs are summed, multiplied together, or otherwise operated upon by the node to generate the node's outputs. These weights are designated $A_{ij}$, $B_{ij}$ to nodes 20, 22, 24, . . . 28, 29 in the wavelet layer, and are designated $W_{ij}$ for nodes 52, 54, . . . 58, 59 in the product layer. The values of these $A_{ij}$, $B_{ij}$, $W_{ij}$ weights are adjusted during training. Through trial and error or other training routines or learning algorithms, eventually higher weights can be given for paths that generate the expected outputs, while smaller weights assigned to paths that do not generate the expected outputs. The machine learns which paths generate the expected outputs and assigns high weights to inputs along these paths.

These weights can be stored in weights memory 100, or in another memory. Since neural networks often have many nodes, there may be many weights to store in weights memory 100. Each weight may require multiple binary bits to represent a range of possible values for that weight. Weights often require 8 to 16 bits. Weights memory 100 can be a SRAM, DRAM, flash memory, disk, or various combinations of these or other computer memory devices.

Figure 9:
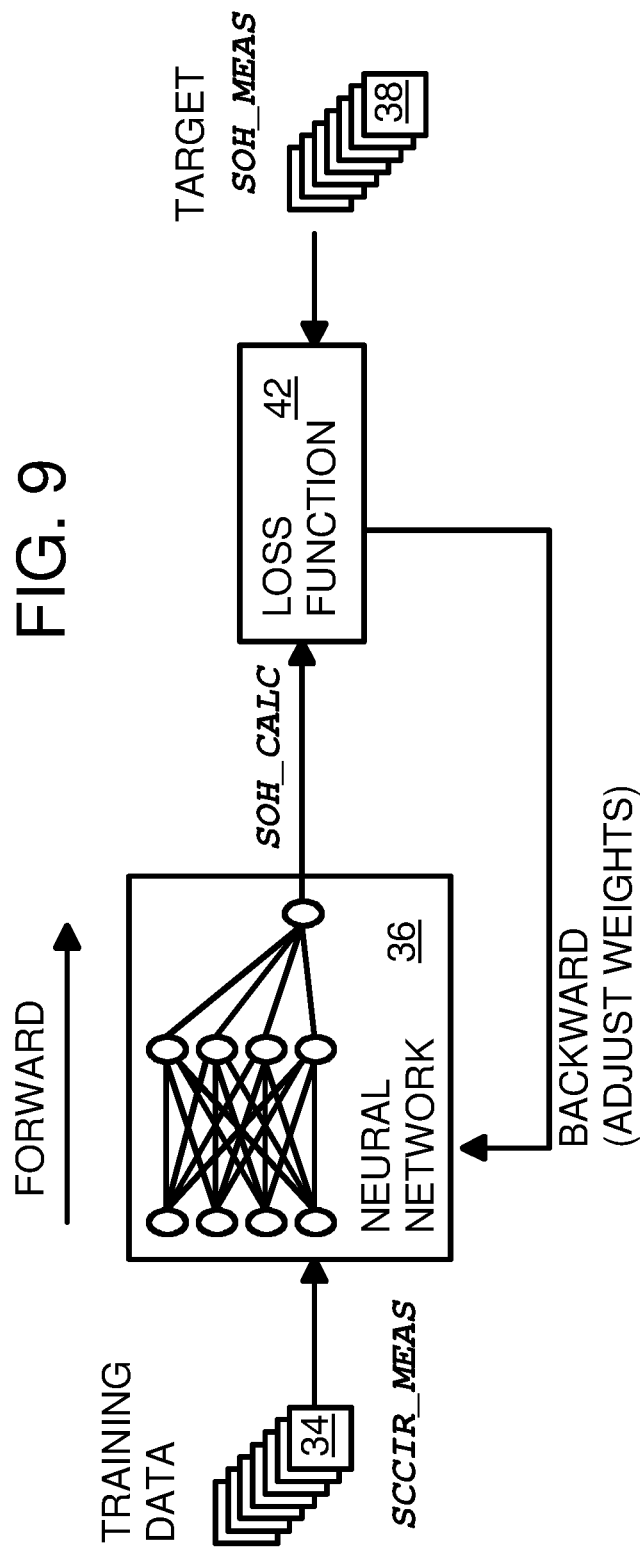
FIG. 9 shows training a neural network using the measured SOH as the target to generate a used-battery calibration model.

FIG. 9 shows training a neural network using the measured SOH as the target to generate a used-battery calibration model. Measurements of aging batteries are made and the measured SCCIR and SOH data are stored in step 130 of FIG. 6. The measured SCCIR data are used as training data 34, SCCIR_MEAS. The measured SOH data that corresponds to the SCCIR_MEAS values are recorded as target data 38, SOH_MEAS. Each value of SOH_MEAS corresponds to a value of SCCIR_MEAS that were measured at the same time in the life of the aging battery tested using the process of FIG. 6.

Neural network 36 receives training data 34 and a current set of weights $A_{ij}$, $B_{ij}$, $W_{ij}$, and operates on training data 34 to generate a result. This generated result is the modeled value of SOH, SOH_CALC. The generated result from neural network 36, SOH_CALC, is compared to target data 38. SOH_MEAS, by loss function 42, which generates a loss value that is a function of how far the generated result is from the target. The loss value generated by loss function 42 is used to adjust the weights applied to neural network 36. Many iterations of weights may be applied by loss function 42 onto training data 34 until a minimum loss value is identified, and the final set of weights used to model the calibration curve.

Rather than generate a single value of SOH_CALC, neural network 36 may have multiple output nodes 60 to generate many SOH_CALC values in parallel from the parallel inputs of SCCIR_MEAS. Loss function 42 may compare in parallel the many values of SOH_CALC to many values of SOH_MEAS to generate a loss function value.

FIG. 10 is a table of calibration sample data for various combinations of V1, V2, and Imid. The SCCIR test can be sensitive to choices for V1, V2, and Imid. Eight combinations of V1, V2, Imid are shown in FIG. 10 and had batteries calibrated using the calibration method of FIG. 6.

Sample 1 is unacceptable because SCCIR remains too close to zero as the battery is aged. The test time is too short since V2–V1 is too small for the current used and Qcc is close to 0. Sample 2 is also unacceptable because SCCIR remains near 100% and Qcv is close to 0. V1, V2, and Imid need to be chosen so that SCCIR is between 0 and 1.0 (0 to 100%) for better test sensitivity. It is difficult to distinguish batteries near 80% SOH.

Figure 11:
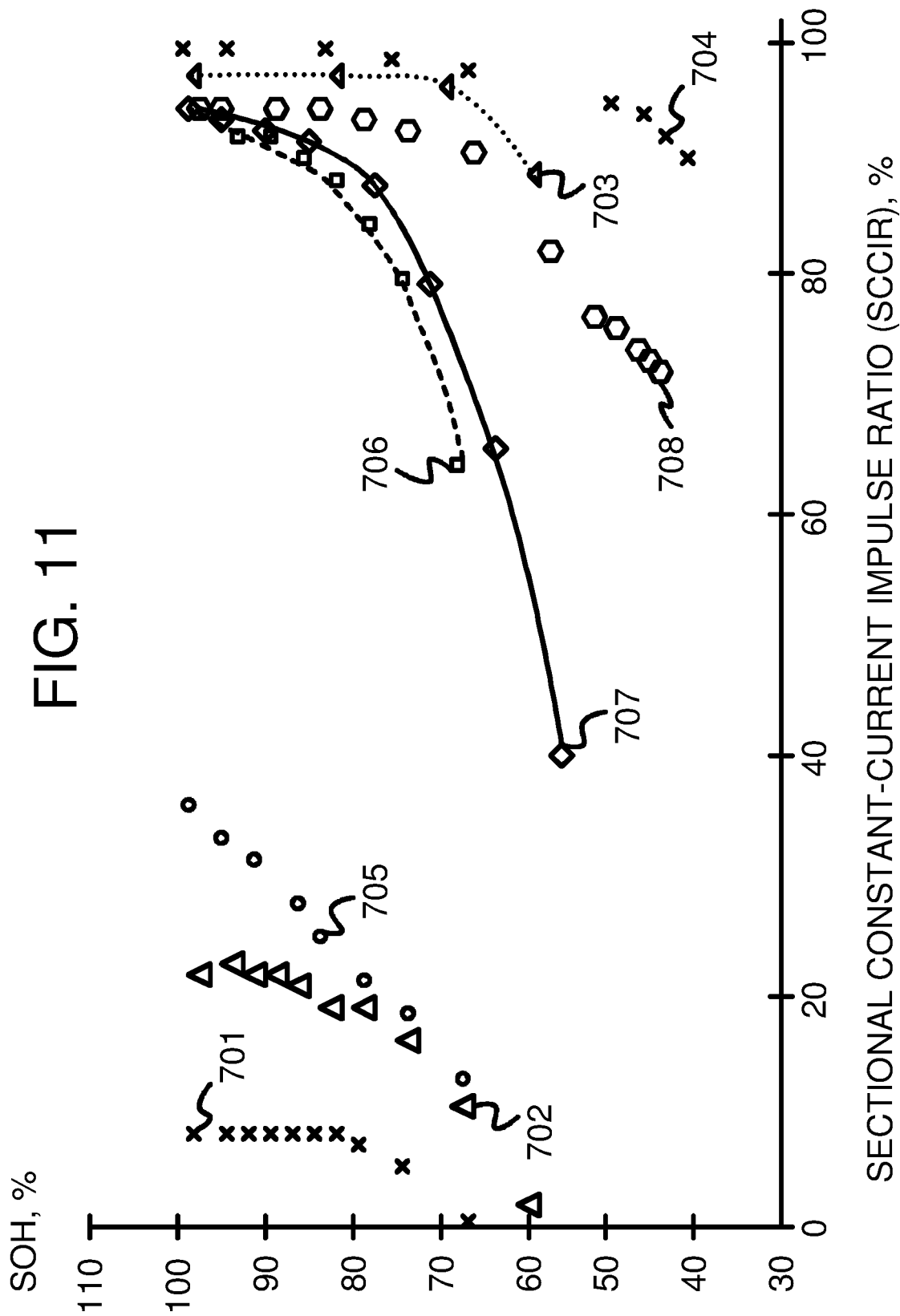
FIG. 11 is a plot of SOH as a function of SCCIR for calibration sample data for various combinations of V1, V2, Imid.

FIG. 11 is a plot of SOH as a function of SCCIR for calibration sample data for various combinations of V1, V2, Imid. Samples 1-8 of FIG. 10 are plotted as sample data 701-708. Sample 3, data 703, has a near-vertical linear segment at about 95% SCCIR when SOH varies from 70-100%. This is undesirable as testing noise could produce a small change in measured SCCIR that would result in a large change in SOH. This is also not practical since it is difficult to distinguish batteries near a target 80% threshold. The SCCIR values of samples 3 and 4 are near 1.0, as Qcv drops more quickly at higher voltages and cutting current to 0.19 C leads to a very small Qcv.

Test accuracy would be poor with sample 3. Sample 4 data 704 likewise has a near-vertical linear characteristic where a slight change in SCCIR produces too large of a change in SOH in a key testing range. Thus samples 3, 4 are unsuitable.

Samples 5-8 have a lower current of 0.15 C compared with the 0.19 C current of unacceptable samples 1-4. The lower current increases test time but provides better sensitivity. Samples 5-8, data 705-708, have a flatter slope than samples 3-4, data 703, 704. Any of samples 5-8 could be used for setting V1, V2, Imid for generating the calibration curve using the method of FIG. 6.

Sample 5, data 705, has a larger V2–V1 than samples 6-8, data 706-708, and has a more limited range of SOH and SCCIR values than samples 6-8. Nevertheless, any of samples 5-8 could be used for setting V1, V2, and Imid. Sample 7, data 707, has the broadest range of SCCIR from 40-95% with SOH of 55-100%.

V2 should be at least 0.2 volt below the nominal battery voltage, the average cell voltage when charged, to prevent SCCIR saturation at 0%. V2–V1 can be smaller than 0.25 volt, resulting in a significant reduction in test time compared with the CCIR method. Saturation of SCCIR near 100% can be prevented by having Imid be at least 0.04 C below constant charging current Icc.

Alternate Embodiments

Several other embodiments are contemplated by the inventors. For example the order or sequence of some steps may be changed. Storing the SCCIR and SOH data, step 130 in FIG. 6, could occur during step 128 rather than after this step, as one example. Various modifications to the neural network may be used, such as having more layers or weights or different functions. More sample points may be inputted, and more iteration cycles or epochs may be used. A very good fit for the model of calibration curve 302 can be obtained using neural network modeling and optimization.

Calibration curve 302 may be implemented as a lookup table that outputs a modeled SOH value when a measured CCIR is input to the lookup table. Calibration curve 302 could also be implemented as a function performed by a processor such as a microprocessor, central processing unit, arithmetic logic unit, co-processor, or other programmed machine. Memory may be shared or separate, local, remote, or various combinations, and processors and other computational blocks may be shared, distributed, local, remote, or various combinations.

While an endpoint for calibration is shown as step 132 in FIG. 6 to be based on a SOH threshold, collection of SCCIR, SOH data could be halted after a certain number of datapoints are collected, or after a certain period of time has elapsed, or a certain number of aging cycles or repeats of step 134, or some other criteria such as Qcc or Qcv becoming 0. For a target above 85%, the calibration curve could be collected above 80% SOH. The testing technician may simply run out of time and halt further data collection and proceed to step 138 to generate the model for calibration curve 302. An initial model could be generated for use, and then later a more refined model from more datapoints is substituted.

Overall testing time for a used battery can be reduced from 26 hours to less than one hour, depending on SOH, V1, V2, and $I_{internal}$, using SCCIR modeling and 0.2 C rather than 0.05 C. The improved accuracy of the SOH estimating method may allow for a higher current to be used with a faster test time.

While integrating current to generate Qcc and Qcv have been described, for constant current integrating may be multiplying the constant current by the time period that the constant current is applied. Various approximations for integrating may be applied, such as using Piece-Wise-Linear (PWL) or multiplying current by time for each of several short time periods. Coulomb counting methods may be used for integrating charge over time. Integrating methods may accumulate the charge transferred over small time periods.

Although an initial deep discharge is not needed, batteries could be pre-discharged or pre-charged in additional steps if desired. The battery could be initially discharged or charged to Vmin rather than to a typically higher voltage V1. Rest periods could be shortened or lengthened. A simple battery bench test setup may be used rather than complicated test benches. Rather than define SCCIR as Qcc/(Qcc+Qcv), an alternative SCCIR could be defined as Qcv/(Qcc+Qcv), and calibration curve 302 adjusted for the new definition.

The calibration curve can be approximated by one or more functions, such as a Piece-Wise-Linear (PWL) or multi-variable function. SOH could be modeled by an equation with terms such as square roots, logarithms, etc., of SCCIR.

The temperature of the battery during testing should be maintained at a constant value, such as room temperature. The length of a rest period after charging or discharging the battery may depend on the charge/discharge current and the thermal properties of the battery. The battery's thermal properties may change with age, such as due to increased internal resistance causing enhanced heating of older batteries.

Many parameters and values may be changed from the examples given. Voltages such as Vmax, Vmin, Vnominal, V2, etc. and currents C, I1 may have different values, or different ratios to one another. Imin can be 0.02 C, Vmax can be 4.2 volts, Vmin can be 2.75 volts, Vnominal can be 3.7 volts, for the samples of V1, V2, Imid shown in FIG. 10, as just one of many examples. The difference V2−V1 could be a small value, such as 0.25V or less. V2 can be less than the battery voltage at 80% State-Of-Charge (SOC) and more than the nominal voltage minus 0.2 volt, with V2>V1. The CV charging current endpoint, Imid, can be between Icc-0.04 C and 0.1 Icc, where Ice is the CC charging current used.

The number of discharge/charge cycles used for each step in the aging process could be adjusted to other values, such as 10 cycles, 100 cycles, etc., depending on how precise calibration curve 302 needs to be. The charging current (Qcc+Qcv) during screening between V1 and V2 can be less than one-quarter of the present charge capacity Cnow that is measured during calibration, allowing for a more rapid screening since the battery being screened is only partially charged with one-quarter of the full battery charge. Qcc+Qcv could be even smaller, such as one-tenth of Cnow, depending on the accuracy of the testing machine. V2−V1 can be one-quarter or one-tenth or less of Vfull−Vempty, the fully-charged and empty voltages of the battery.

The number of batteries tested for calibration could be a relatively small number such as 3 batteries when AI modeling is effective, or more batteries, such as 100 batteries, may be tested for calibration when less-effective modeling is used, or when more accurate calibration is needed. Some battery reuse applications may not require accurate SOH modeling. Ideally, the batteries tested for calibration closely match the batteries being screened, such as having the same manufacturer and model. The battery being tested can be a single battery or a battery pack, single cell or multi cell.

Some test error may be tolerated, depending on the application or intended use of the reused batteries. A test error of +/−3% of the actual SOH may be obtained in some cases. Test time may be reduced when a larger current is able to be used for a desired test accuracy or error tolerance.

Some embodiments may not use all components. Additional components may be added. Loss function 42 may use various error/loss and cost generators, such as a weight decay term that prevents weights from growing too large over many cycles of training optimization, a sparsity penalty that encourages nodes to zero their weights, so that only a small fraction of total nodes is needed. Many substitutions, combinations, and variations are possible. Other variations and kinds of loss or cost terms can be added to loss function 42. The values of the relative scaling factors for the different cost functions can be adjusted to balance the impact of the various functions. The training endpoint for the neural network may be set for various combinations of conditions, such as a desired final accuracy, an accuracy-hardware cost product, a target hardware cost, etc.

Neural network 36, loss function 42, and other components may be implemented in a variety of technologies, using various combinations of software, hardware, firmware, routines, modules, functions, etc. The final product, Calibration curve 302 or a calibration function generator, may be derived from neural network 36 with the final weights, and might be implemented as a program module, or in an Application-Specific Integrated Circuit (ASIC) or other hardware to increase processing speed and lower power consumption.

The background of the invention section may contain background information about the problem or environment of the invention rather than describe prior art by others. Thus, inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A method for screening a battery for reuse or disposal comprising:
   (a) charging the battery from a starting voltage with a constant current until a battery voltage reaches a voltage threshold;
   wherein the voltage threshold is less than a full voltage of the battery when the battery is fully charged;
   wherein the starting voltage is between the full voltage when the battery is fully charged and an empty voltage when the battery is fully discharged, or the starting voltage is equal to the empty voltage;
   (b) multiplying a value of the constant current by a Constant-Current (CC) time period during which the constant current is applied to the battery to reach the voltage threshold to generate a constant-current charge value that is stored in a computer memory;
   (c) after the voltage threshold is reached, partially charging the battery with a constant voltage until a variable current applied to the battery voltage reaches a current threshold;
   (d) integrating a value of the variable current over a Constant-Voltage (CV) time period that the constant voltage and variable current are applied to the battery to reach the current threshold to generate a constant-voltage charge value that is stored in the computer memory;
   (e) generating a Sectional Constant-Current Impulse Ratio (SCCIR) by dividing the constant-current charge value by a sum of the constant-current charge value and the constant-voltage charge value;
   inputting the SCCIR to a calibration function processor that outputs a modeled State of Health (SOH) value that corresponds to the SCCIR input to the calibration function processor; and
   using the modeled SOH value to classify the battery for reuse when the modeled SOH value is above a SOH threshold, and to classify the battery for disposal when the modeled SOH value is below the SOH threshold.

2. The method of claim 1 wherein a first difference between the voltage threshold and the starting voltage is less than one quarter of a second difference between the full voltage and the empty voltage,
   wherein battery screening to generate the SCCIR is accelerated by only partially charging the battery over less than one quarter of a full voltage range of the battery.

3. The method of claim 2 wherein step (a) further comprises:
   discharging the battery to a starting voltage before applying the constant current, wherein the battery is charged from the starting voltage to the voltage threshold during the CC time period.

4. The method of claim 3 further comprising:
   pre-screening the battery by measuring an initial voltage of the battery before discharging the battery to the starting voltage, and discarding the battery when the initial voltage of the battery is less than a minimum pre-screened voltage;
   wherein the constant current is no more than 20% of a maximum battery current.

5. The method of claim 3 further comprising:
   sorting the battery into one of multiple bins in response to the modeled SOH value, wherein each of the multiple bins receives batteries having a different range of modeled SOH values.

6. The method of claim 3 further comprising:
   generating a SCCIR-SOH model that programs the calibration function processor to generate the modeled SOH values from input SCCIR values by:
   (f) performing steps (a) to (e) on a new battery and storing the SCCIR as a model-input SCCIR value;
   (g) fully charging the new battery to the full voltage and then discharging the new battery with the constant current during a capacity-measuring time period that ends when the new battery reaches the empty voltage;
   (h) multiplying the value of the constant current by the capacity-measuring time period to generate a present capacity charge value that is stored in the computer memory;
   (i) generating a model-input SOH value by dividing the present capacity charge value by an initial capacity charge value, wherein the initial capacity charge value is the present capacity charge value before the new battery is aged by step (j);
   (j) aging the new battery by repeatedly charging and discharging the new battery over N charge/discharge cycles, wherein N is a whole number of at least 10;
   repeating steps (f) to (i) after the new battery is aged;
   using the model-input SCCIR values and the model-input SOH values to generate parameters that describe the SCCIR-SOH model that programs the calibration function processor to generate the modeled SOH values from input SCCIR values.

7. The method of claim 6 wherein using the model-input SCCIR values and the model-input SOH values to generate parameters that describe the SCCIR-SOH model further comprises:
(m) inputting the model-input SCCIR values to input of a neural network;
using the neural network to process the model-input SCCIR values to generate a calculated SOH value;
comparing the calculated SOH value to the model-input SOH value using a loss function to generate a loss value;
using the loss value to adjust weights to nodes within the neural network and repeating from step (m) until a modeling endpoint is reached;
storing the weights in a computer memory connected to the neural network;
when the modeling endpoint is reached, using final values of the weights with the neural network to generate the modeled SOH value from the SCCIR input to implement the calibration function processor that generates the modeled SOH values from input SCCIR values.

8. The method of claim 7 wherein the neural network comprises a first layer of nodes that perform wavelet functions, and a second layer of nodes that perform product functions, and a third layer of nodes that perform summing functions.

9. The method of claim 7 further comprising:
(k) comparing the model-input SOH value to an endpoint SOH value;
when the model-input SOH value is greater than the endpoint SOH value, continuing from step (j) to continue aging the new battery;
when the model-input SOH value is not greater than the endpoint SOH value, jump to step (m) to generate the SCCIR-SOH model.

10. A battery screening method comprising:
initially discharging a battery using an initial constant current until a first voltage target is reached;
cooling the battery after initial discharge for a period of rest time;
partially charging the battery using a constant current until a second voltage target is reached and recording a Constant-Current charge, Qcc, of charge transferred to the battery by the constant current as the battery is charged from the first voltage target to the second voltage target;
switching to a Constant-Voltage (CV) charging process when the second voltage target is reached, and recording a Constant-Voltage charge, Qcv, of charged transferred to the battery during the CV charging process;
calculating a Sectional Constant-Current Impulse Ratio (SCCIR) as a ratio of one of the group consisting of Qcc and Qcv, to a sum of Qcc and Qcv;
inputting the SCCIR to a calibration function generator that returns a modeled State of Health (SOH) value that corresponds to a value of the SCCIR inputted;
using the modeled SOH value to determine when the battery is to be discarded and when the battery is to be reused,
whereby the battery is screened based on the modeled SOH value that is a function of the SCCIR measured.

11. The battery screening method of claim 10 wherein partially charging the battery using the constant current until the second voltage target is reached further comprises transferring a partial charge to the battery, the partial charge being less than one quarter of a full charge of the battery;
wherein battery screening time is reduced by only partially charging the battery to generate the SCCIR.

12. The battery screening method of claim 11 further comprising:
during the Constant-Voltage (CV) charging process, allowing a charging current to vary while maintaining a constant voltage applied to the battery; and
terminating the CV charging process when a midrange current target is reached for the charging current.

13. The battery screening method of claim 12 further comprising:
generating calibration datapoints by aging and measuring a plurality of new batteries, each new battery being processed by a calibration data-collection process that comprises:
(a) initially charging or discharging the new battery using an initial constant current until the first voltage target is reached;
cooling the new battery after initial discharge for a period of rest time;
partially charging the new battery using the constant current until the second voltage target is reached and recording a Constant-Current charge, Qcc, of charge transferred to the new battery by the constant current;
switching to the Constant-Voltage (CV) charging process when the second voltage target is reached, and recording a Constant-Voltage charge, Qcv, of charged transferred to the new battery during the CV charging process;
calculating a datapoint Constant-Current Impulse Ratio (SCCIR) as a ratio of one of the group consisting of Qcc and Qcv, to a sum of Qcc and Qcv;
fully charging the new battery to a full voltage that is greater than the first voltage target;
fully discharging the new battery using the constant current until an empty voltage is reached, wherein the empty voltage is less than the second voltage target, and recording a present charge capacity as an integral of the constant current discharged from the new battery;
generating a datapoint State of Health (SOH) value as a ratio of the present charge capacity to an initial charge capacity of the new battery before aging;
storing the datapoint SCCIR and the datapoint SOH value as a calibration datapoint;
aging the new battery by charging and discharging the new battery N times, wherein N is a whole number of at least 10;
repeating from step (a).

14. The battery screening method of claim 13 further comprising:
when the datapoint SOH value is less than a threshold SOH value, ending the calibration data-collection process.

15. The battery screening method of claim 13 wherein the present charge capacity is at least ten times greater than sum of Qcc and Qcv, wherein Qcc is measured between the first voltage target and the second voltage target, while the present charge capacity is measured between the full voltage and the empty voltage;
wherein a first difference between the first voltage target and the second voltage target is less than a quarter of a second difference between the full voltage and the empty voltage,
wherein battery screening time is reduced by only partially charging the battery to generate the SCCIR.

16. The battery screening method of claim 15 further comprising:
using a plurality of the calibration datapoint as inputs to a model generator that programs the calibration function generator;
(b) inputting a plurality of the datapoint SCCIR as inputs to an input layer of a neural network that generates a plurality of calculated outputs as a function of the inputs and a plurality of weights;
comparing the plurality of calculated outputs to a plurality of the datapoint SOH value using a loss function to adjust the plurality of weights;
repeating from step (b) using adjusted values of the plurality of weights until the loss function reaches an endpoint;
applying the plurality of weights when the endpoint is reached to the neural network to generate a calculated output for a SCCIR input, the calculated output being the modeled SOH value of the calibration function generator.

17. A battery State of Health (SOH) estimating method comprising:
discharging/charging a battery using an initial constant current until a first voltage target is reached on the battery;
charging the battery using a constant current until a second voltage target is reached by the battery, and determining a Qcc charge transferred to the battery by the constant current;
continuing to charge the battery after the second voltage target is reached using a variable current to maintain a constant voltage on the battery;
determining a Qcv charge transferred to the battery by the variable current;
calculating a Sectional Constant-Current Impulse Ratio (SCCIR) as a ratio of the Qcc charge to a sum of the Qcc charge and the Qcv charge;
inputting the SCCIR to a processor, the processor outputting a modeled SOH that is a function of the SCCIR; and
comparing the modeled SOH to a SOH threshold as a basis for sorting the battery for disposal or for reuse,
whereby the battery is sorted based on the modeled SOH that is determined by the SCCIR measured for the battery.

18. The battery State of Health (SOH) estimating method of claim 17 further comprising:
collecting datapoints by aging new batteries with multiple charge/discharge cycles and measuring their SCCIR values and SOH values;
generating a calibration curve that best fits the datapoints;
the processor using the calibration curve to generate the modeled SOH from the SCCIR input to the processor.

19. The battery State of Health (SOH) estimating method of claim 18 further comprising:
discharging the new batteries with the constant current until a low voltage target that is less than the first voltage target is reached, and integrating the constant current to generate a present charge capacity;
generating the SOH values of the aging new batteries as a ratio of the present charge capacity to an initial present charge capacity before aging;
wherein (Qcc+Qcv) is less than one-quarter of the present charge capacity, wherein the battery is only partially charged between the first voltage target and the second voltage target during estimation, and is fully charged when generating the present charge capacity during calibration.

20. The battery State of Health (SOH) estimating method of claim 19 further comprising:
inputting the datapoints to a neural network to generate the calibration curve.

* * * * *